United States Patent [19]
Estes

[11] Patent Number: 5,590,029
[45] Date of Patent: Dec. 31, 1996

[54] CIRCUIT BOARD SMT DEVICE MOUNTING APPARATUS

[75] Inventor: H. Scott Estes, Austin, Tex.

[73] Assignee: Dell USA, L.P., Austin, Tex.

[21] Appl. No.: 371,720

[22] Filed: Jan. 12, 1995

[51] Int. Cl.$^6$ ........................................... H05K 7/02
[52] U.S. Cl. .................. 361/760; 361/783; 361/785; 361/807; 361/809; 439/78; 174/260
[58] Field of Search .................... 439/61–62, 68, 439/78, 83; 361/760–764, 768, 775, 782–783, 784–785, 792, 803, 807, 809; 174/260–266

[56] References Cited

U.S. PATENT DOCUMENTS

| | | |
|---|---|---|
| 2,894,241 | 7/1959 | McKee . |
| 5,133,669 | 7/1992 | Barnhouse et al. .................. 439/78 |
| 5,321,585 | 6/1994 | Trittschuh, III et al. .............. 361/784 |

*Primary Examiner*—Bot L. Ledynh
*Attorney, Agent, or Firm*—Skjerven, Morrill, MacPherson, Franklin & Friel; Stephen A. Terrile

[57] ABSTRACT

A space-saving circuit board mounting of a Surface Mounted Technology (SMT) device, such as a resistor, capacitor, ferrite or clock oscillator, is achieved using (1) a single through hole extending transversely through the board substrate, and (2) a cylindrical adapter having a first longitudinal portion coaxially received in the through hole and a second longitudinal portion projecting outwardly therefrom. The second longitudinal adapter portion has a radially inwardly extending notch that receives the SMT device and positions it with its electrically conductive opposite end sections spaced apart in a direction parallel to the axis of the through hole. Spaced apart external metal plating sections on the adapter connect the SMT device end portions to circumferentially separated metal plating segments on the surface of the through hole which, in turn, are representatively connected to ground and signal plane structures within the interior of the board substrate.

19 Claims, 3 Drawing Sheets

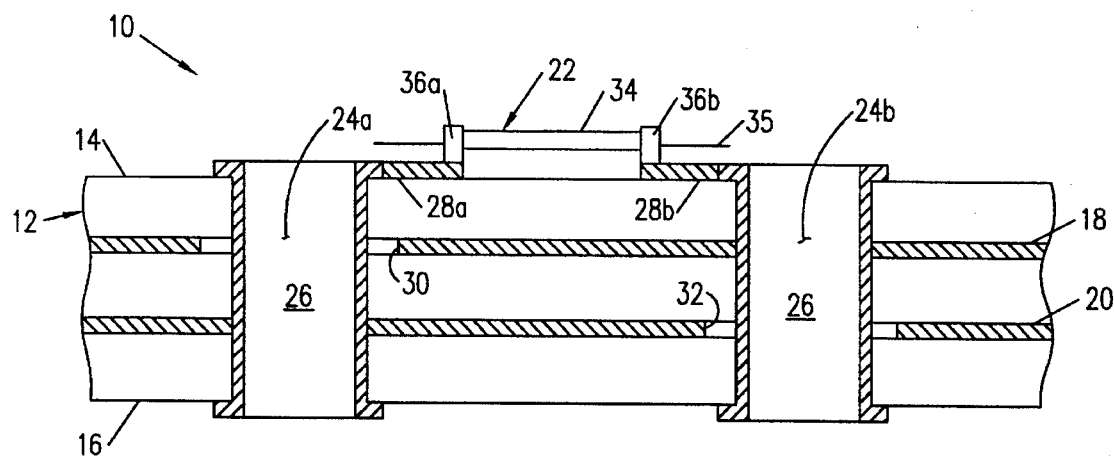
FIG. 1 (PRIOR ART)
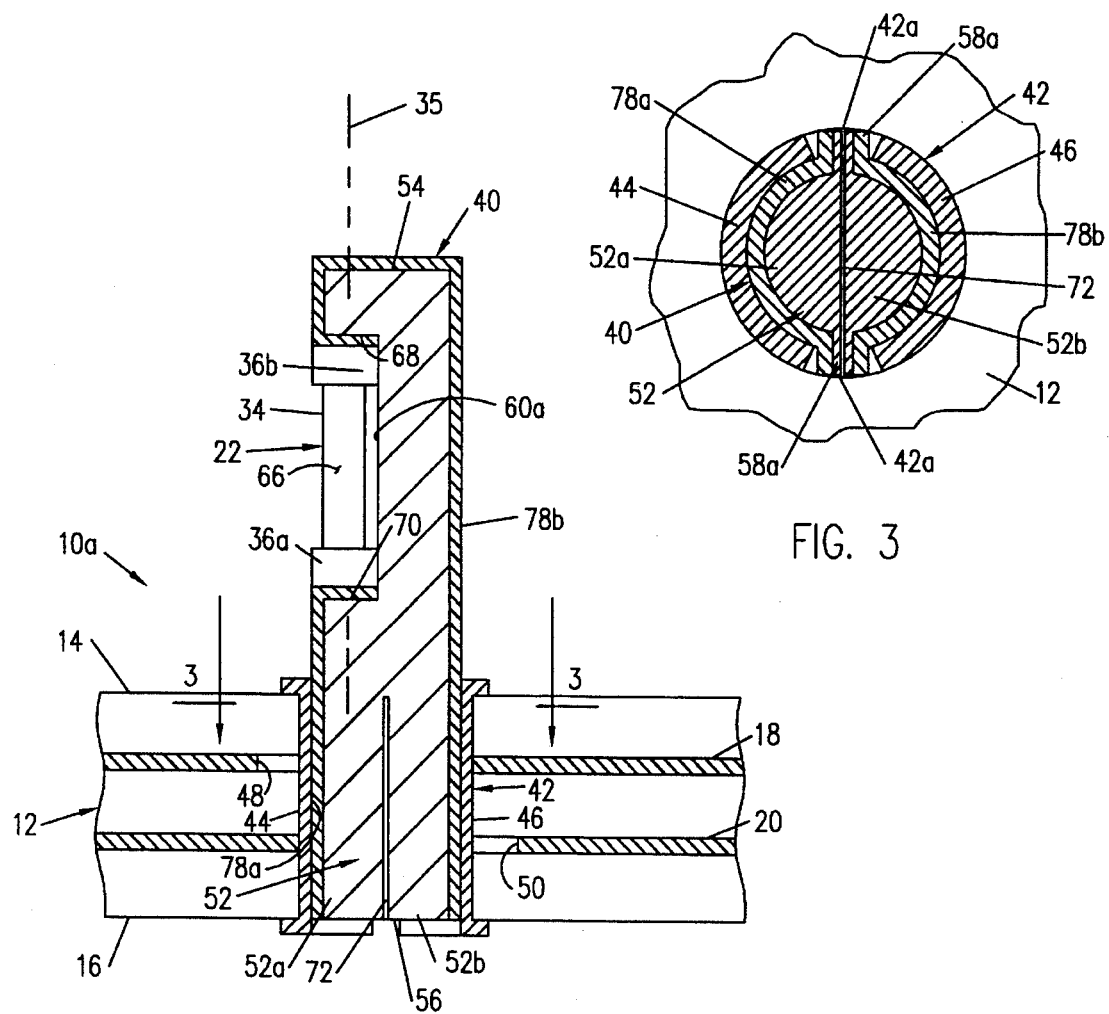
FIG. 2
FIG. 3

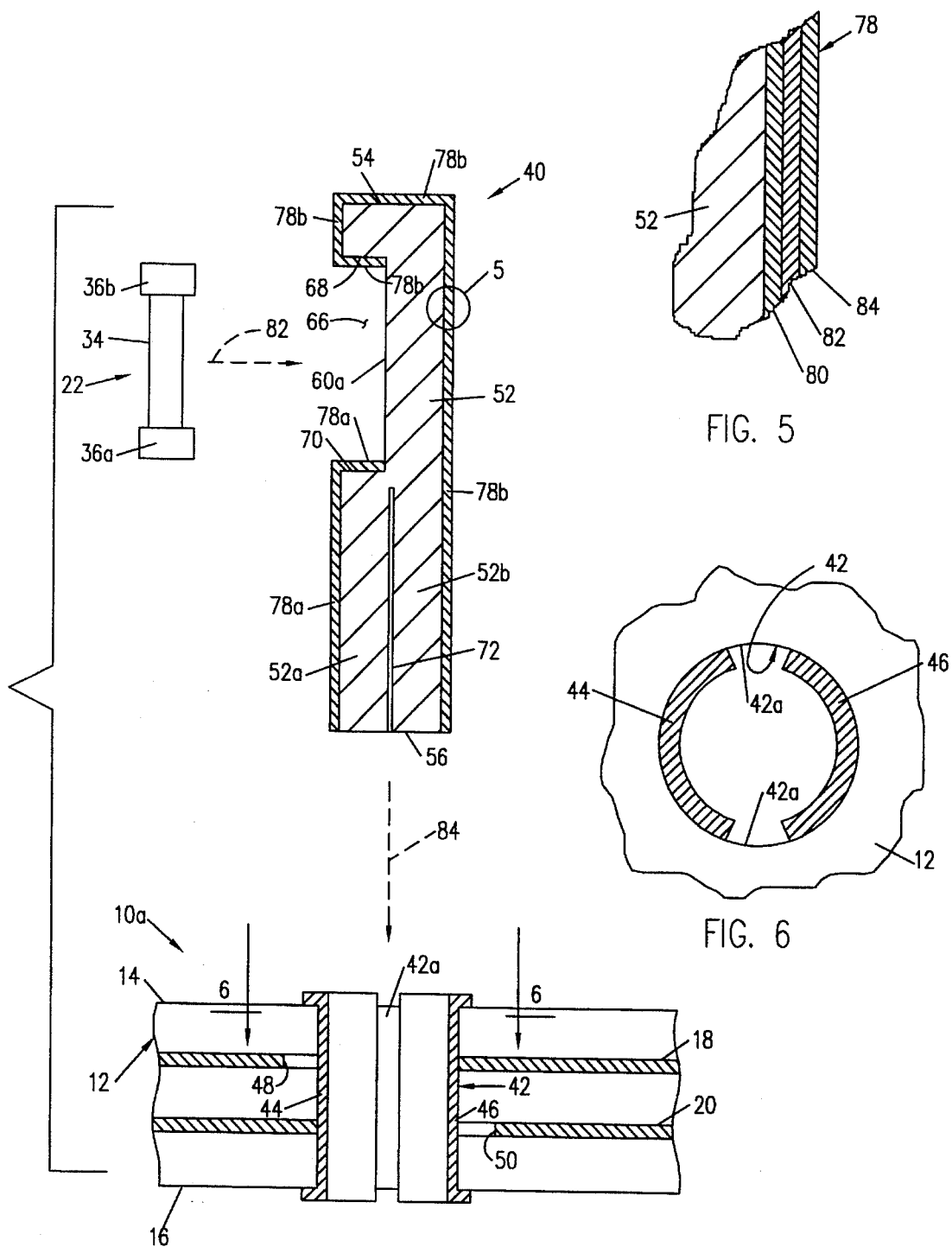

CIRCUIT BOARD SMT DEVICE MOUNTING APPARATUS

BACKGROUND OF THE INVENTION

The present invention generally relates to circuit board apparatus, and more particularly relates to apparatus and methods for mounting a Surface Mount Technology (SMT) device on a circuit board.

As modern circuit boards become more densely packed with electronic components carried thereon, and signal speeds continue to increase, there is a growing need for resistors, capacitors and ferrites that can be surface mount installed, yet be connected to shielded internal traces within the circuit board. Surface Mount Technology (SMT) devices have been previously used in this application and typically have small rectangular block-like configurations defined by an elongated dielectric body portion having electrically conductive end sections.

The conventional technique used in mounting an SMT device on a circuit board and electrically coupling the device between, for example, ground and signal plane portions of the circuit board within its substrate is to (1) form through the substrate a spaced pair of conductively plated through holes, or "vias", that are respectively coupled to the ground and signal planes, (2) form on a side surface of the substrate a spaced pair of electrically conductive mounting pads, each of which is electrically coupled to the plating of one of the through holes, and (3) solder the electrically conductive end sections of the SMT device to the mounting pads on the outer side surface of the circuit board substrate.

The circuit board side surface space requirement inherent in this conventional use of two conductively plated through holes and associated surface mounting pads to connect each SMT device to internal tiers within the circuit board substrate, such as ground and signal planes, becomes considerably less acceptable as the required component density and signal speeds continue to increase in rapidly evolving modern circuit board technology.

From the foregoing it can readily be seen that it would be highly desirable to provide improved apparatus and methods for operatively mounting an SMT device on a circuit board, and electrically coupling the device between interior portions of the circuit board, in a manner requiring less board side surface space than in the conventional SMT device mounting method generally described above. It is accordingly an object of the present invention to provide such improved apparatus and methods.

SUMMARY OF THE INVENTION

In carrying out principles of the present invention, in accordance with a preferred embodiment thereof, specially designed circuit board apparatus is provided in which an SMT ("Surface Mount Technology") type electronic component, such as a resistor, capacitor, ferrite or clock oscillator is mounted in a unique manner substantially reducing the board side surface area required by the mounted component.

From a broad perspective the circuit board apparatus comprises a circuit board structure including a dielectric substrate member having opposite first and second side surfaces, spaced apart first and second electrically conductive structures carried by the substrate member, and a through hole extending through the substrate member and opening outwardly through the first and second side surfaces thereof. The through hole extends along a first axis and has an interior side surface. Spaced apart and electrically isolated first and second electrically conductive plating segments are disposed on the interior through hole side surface and are respectively coupled to the first and second electrically conductive structures carried by the substrate member.

The SMT type electronic component has opposite first and second electrically conductive end sections spaced apart along a second axis. Support means are complementarily received in the through hole and extend outwardly therefrom past the first substrate side surface. The support means are operative to (1) support the electronic component outwardly of the first substrate side surface in an orientation in the first and second axes are in a parallel, adjacent relationship, and (2) electrically couple the first and second through hole plating sections, respectively, to the first and second end sections of the electronic component.

Using this unique mounting technique, the SMT device may be operatively interconnected between, for example, internal substrate ground and signal plane structures using little if any more substrate side surface space than that taken up by the single, segmentally plated through hole.

In a preferred embodiment thereof, the circuit board apparatus comprises a dielectric substrate member having opposite first and second side surfaces; spaced apart first and second electrically conductive structures disposed within the substrate member; a through hole extending through the substrate member and opening outwardly through the first and second side surfaces, the through hole having an interior side surface; and circumferentially spaced apart first and second electrically conductive metal plating segments disposed on the interior side surface of the through hole and respectively coupled to the first and second electrically conductive structures.

The support means include an adapter structure having a generally cylindrical dielectric body extending along an axis and having a first longitudinal portion coaxially received in the through hole, and a second longitudinal portion extending outwardly from the through hole. A lateral notch is formed in the second longitudinal adapter structure portion and has a nonplated inner side surface extending between first and second facing end surfaces disposed generally transversely to the adapter structure axis and respectively facing the outer ends of the first and second longitudinal portions of the dielectric body. A first exterior metal plating section is electrically coupled to the first through hole plating segment and extends therefrom along the body into the notch along the second end wall thereof. A second exterior metal plating section is electrically isolated from the first exterior metal plating section, is electrically coupled to the second through hole plating segment, and extends therefrom along the body into the notch along the first end surface thereof.

The SMT type electronic component has first and second electrically conductive opposite end sections spaced apart along an axis. The electronic component is received within the adapter structure body notch with the component axis being generally parallel to the body axis. The first component end section is electrically coupled to the portion of the second exterior metal plating section extending along the first end surface of the adapter body notch, and the second component end section is electrically coupled to the portion of the first exterior metal plating section extending along the second end surface of the adapter structure body notch.

Preferably, the portions of the first and second exterior metal plating sections respectively face and are soldered to the first and second through hole metal plating sections, and the first and second end sections of the electronic component are respectively soldered to the portions of the second and first exterior metal plating sections extending across the first and second end surfaces of the body notch.

The body of the adapter structure is preferably formed from a plastic material, and the second longitudinal portion of the body has an outer end and a slot extending inwardly therethrough and generally dividing the second longitudinal body portion into facing lateral halves that may be resiliently deformed toward one another to facilitate the insertion of the adapter structure into the through hole.

In the preferred circuit board apparatus embodiment, the first and second through hole plating segments are circumferentially separated by unplated portions of the interior side surface of the through hole, and the adapter structure body has diametrically opposite ribs extending along its length. The ribs have unplated outer side surfaces, are received in the circumferential through hole spaces between the first and second through hole plating segments, and function to circumferentially align the adapter structure with the through hole plating segments.

According to another feature of the present invention, a series of SMT device mounting adapters may be conveniently fabricated by first forming a plastic molding having a mutually spaced series of parallel, generally cylindrical body portions, with each laterally adjacent pair of body portions being joined along their lengths by a generally rectangular web. The plastic molding has a lateral notch formed therein and extending through longitudinally aligned segments of the body portions, between their opposite ends, to similarly facing first sides of the webs, the notch having an inner side portion extending transversely through the body portions and along the first sides of the webs, and opposite end surfaces at each of the body portions. The distance between the opposite notch end surfaces at each body portion being slightly greater than the lengths of the SMT type electrical components to mounted in the notches.

The inner side portion of the notch is masked with a plating resist material, and the partially masked plastic molding is plated with a metal material. The individual plated body portions are then separated from one another by longitudinally cutting each web into lateral halves to thereby form on each separated body portion a diametrically opposed pair of laterally outwardly projecting ribs longitudinally extending along its length. Preferably, the previously mentioned axial body slot is formed longitudinally through these ribs.

BRIEF DESCRIPTION OF THE DRAWINGS

FIG. 1 (Prior Art) is a simplified cross-sectional view through a representative circuit board having an SMT device conventionally mounted on an outer side surface thereof and operatively connected to interior ground and signal plane portions of the circuit board;

FIG. 2 is a simplified cross-sectional view through a representative circuit board having an SMT device operatively mounted thereon, and connected to interior ground and signal plane portions thereof, using a specially designed, space-saving adapter structure embodying principles of the present invention;

FIG. 3 is an enlarged scale partial cross-sectional view through the FIG. 2 circuit board taken along line 3—3 of FIG. 2;

FIG. 4 is an enlarged scale exploded cross-sectional view of the circuit board, adapter structure and SMT device shown in FIG. 3;

FIG. 5 is an enlarged scale detail view of the circled area "5" in FIG. 4;

FIG. 6 is an enlarged scale cross-sectional view through the FIG. 4 circuit board taken along line 6—6 of FIG. 4;

DETAILED DESCRIPTION

Figure 7:
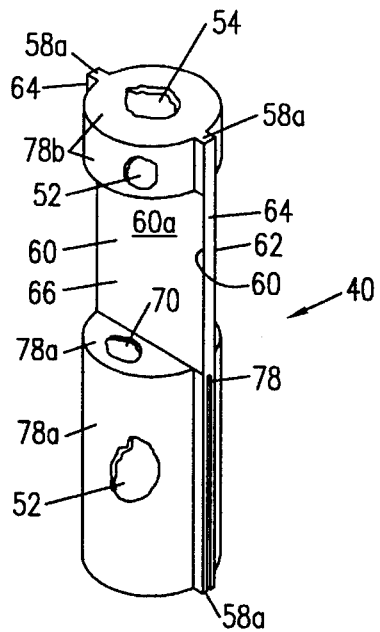
FIG. 7 is an enlarged scale, partially cut away perspective view of the SMT adapter structure.

A portion of a conventionally constructed circuit board 10 is illustrated in simplified, somewhat schematic cross-sectional form in FIG. 1 (Prior Art) and includes a dielectric substrate member 12 having opposite top and bottom sides 14 and 16. The circuit board 10 is of a multi-tier construction and has within the dielectric substrate member 12 spaced apart parallel ground and signal planes 18 and 20 together with various other electrically conductive layers (not illustrated).

A Surface Mount Technology (SMT) device 22, which may representatively be a resistor, capacitor, ferrite or clock oscillator, is operatively mounted on the top side 14 of the circuit board 10, and electrically coupled between the ground and signal planes 18 and 20, using conventional mounting apparatus. Such conventional mounting apparatus includes (1) a spaced pair of through holes 24a,24b each extending between the opposite substrate sides 14,16 and plated with an electrically conductive material 26 such as copper, and (2) a spaced pair of electrically conductive metallic mounting pads 28a,28b positioned on the substrate side surface 14 between the through holes 22 and electrically coupled to the plating 26 of the through holes 24a and 24b, respectively, as shown. The plating 26 of the through hole 24a is electrically connected to the signal plane 20, but passes through an enlarged opening 30 formed in the ground plane 18 and serving to isolate the ground plane 18 from the plating 26 of the through hole 24a. The plating 26 of the through hole 24b is electrically connected to the ground plane 18, but passes through an enlarged opening 32 formed in the signal plane 20 and serving to isolate the ground signal plane 20 from the plating 26 of the through hole 24b.

The illustrated SMT device 22 is of a conventional construction and has a horizontally elongated rectangular dielectric body portion 34, longitudinally extending along an axis 35, with opposite rectangular, electrically conductive end sections 36a,36b. The axis 35 of the SMT device 22 is horizontally oriented relative to the upper substrate side 14, and the device 22 has its electrically conductive end sections 36a,36b respectively overlying and soldered to the surface mount pads 28a,28b. Accordingly, the device end section 36a is electrically coupled to the signal plane 20 via the pad 28a and the plating 26 of the through hole 24a, and the device end section 36b is electrically coupled to the ground plane 18 via the pad 28b and the plating 26 of the through hole 24b.

It can be seen that, as viewed in FIG. 1 (Prior Art), the overall left-to-right horizontal board space required to conventionally mount the SMT device 22 on the substrate 12 and operatively interconnect the device 22 between the ground and signal planes 18,20 (i.e., the distance between the left side of the through hole 24a and the right side of the through hole 24b) is considerably greater than the length of the SMT device 22.

Referring now to FIG. 2, the present invention substantially reduces the horizontal board space required to operatively mount the SMT device 22 on a similar circuit board 10a, as may be readily seen by comparing FIGS. 1 and 2. This very desirable board mounting space reduction is achieved using a specially designed adapter structure 40 that vertically carries the SMT device 22 (i.e., with its longitudinal axis 35 perpendicular to the substrate side 14) and is received in a single, segmentally plated through hole 42 extending between the opposite substrate sides 14,16 of the circuit board 10a. Accordingly, as illustrated in FIG. 2, the left-to-right horizontal board space required to operatively mount the SMT device 22 using the adapter structure 40 is on the order of the width of the single through hole 42, depending on the thickness of the device 22 perpendicular to its longitudinal axis 35.

Turning now to FIGS. 3, 4 and 6, the single through hole 42 has, along its length, a circumferentially spaced pair of metal plating segments 44,46 (representatively copper segments) that are circumferentially separated, and thus electrically isolated from one another, by diametrically opposed unplated dielectric segments 42a of the interior side surface of the through hole 42. The segmentally plated through hole 42 may be formed by plating its entire interior side surface and then appropriately removing plating sections to form the unplated segments 42a, or by masking the dielectric segments 42a before plating the through hole 42. As best illustrated in FIG. 4, the segmentally plated through hole 42 passes through an opening 48 formed in the interior ground plane 18 of the circuit board 10a, and passes through an opening 50 formed in the interior signal plane 20 of the circuit board 10a. Opening 48 is configured in a manner such that only the plating segment 46 engages and is electrically coupled to the ground plane 18, and opening 50 is configured in a manner such that only the plating segment 44 engages and is electrically coupled to the signal plane 20.

With reference now to FIGS. 4 and 7, the adapter structure 40 has an elongated circular cylindrical dielectric body portion 52 representatively of a plastic material) having top and bottom ends 54 and 56, and diametrically opposite rectangularly cross-sectioned ribs 58a projecting radially outwardly from the body portion 52 along its entire length. Each rib 58a has a pair of opposite sides 60 and 62, and an outer side edge 64 extending between the sides 60 and 62. A radial notch 66 is formed in an upper longitudinal portion of the dielectric body 52 and extends inwardly through the body 52 to the sides 60 of the ribs 58a. Notch 66 has an inner side wall 60a which is essentially coplanar with the rib sides 60, and upper and lower facing end walls 68 and 70 separated by a distance just slightly greater than the length of the SMT device 22. For purposes later described herein, a lower longitudinal portion of the dielectric body 52 (below the bottom notch end wall 70) is split into two diametrically opposite sections 52a and 52b by a narrow slot 72 extending upwardly through the bottom end 56 of the dielectric body 52 and the lower ends of the ribs 58a.

Figure 8:
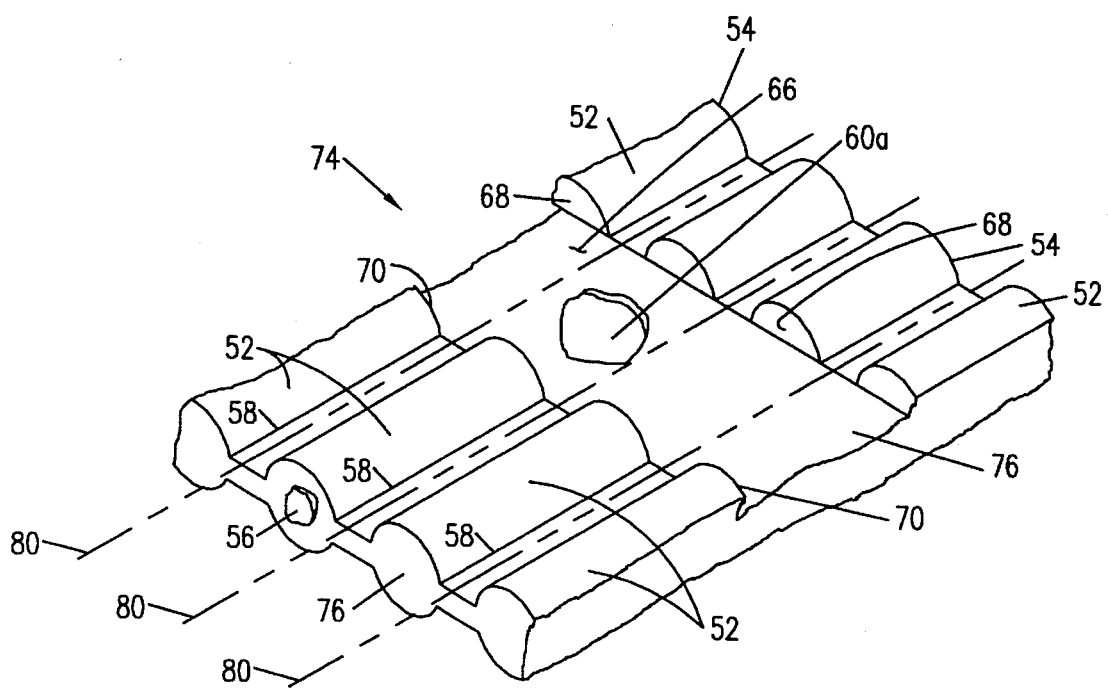
FIG. 8 is a perspective view of a plastic molding used in manufacturing a number of the SMT adapters.

Referring now to FIGS. 4, 7 and 8, a series of individual adapters 40 (see FIGS. 4 and 7) may be conveniently formed from a plastic injection molding 74 (see FIG. 8) having a spaced series of parallel cylindrical body portions 52 joined to one another by lateral web sections 58 and having a transverse notch 66 extending down to the top sides of the webs 58. Notch 66 has an inner side surface 60a extending along the top sides of the webs 58, and opposing end surfaces 68 and 70 on facing longitudinal sections of each body portion 52.

As illustrated in FIG. 8, the first step in forming the individual adapters 40 from the plastic molding 74 is to place a suitable plating resist masking material 76 on the entire inner side surface 60a of the notch 66, the left end surfaces 56 of the body portions 52, and the left end surfaces of the webs 58. Next, the partially masked molding 74 is subjected to a suitable metal plating process to form on the nonmasked portions of the molding 74 a metal coating 78 (see FIG. 5) that preferably comprises an electroless copper inner layer 80, an electroplated copper intermediate layer 82, a nickel under layer 84, and a solderable tin on a tin/lead outer layer. The masking material 76 prevents the deposition of metal on the inner side of the notch 66, the left end surfaces 56 of the body portions 52, and the left end surfaces of the webs 58.

The partially metal-plated plastic molding 74 is then separated into individual adapters 40 (see FIG. 7) by longitudinally cutting each web 58 along its lateral midpoint line 80 (see FIG. 8). The cutting of the metal plated webs 58 in this manner creates the ribs 58a on each resulting adapter 40, with the outer side edge 64 on each rib being devoid of metal plating. After the individual adapters 40 have been separated from the molding in this manner, the longitudinal bottom end slots 72 are formed in the adapters 40 as shown in FIG. 7.

Turning now to FIGS. 4 and 7, the metal plating 78 formed on each adapter 40 has two electrically isolated sections 78a and 78b.

Plating section 78a horizontally extends along the bottom notch end surface 70 and extends downwardly therefrom along a first circumferential half of the body portion 52 to the bottom end 56 of the body portion 52. Plating section 78b sequentially extends horizontally along the top notch end surface 68, upwardly along the first circumferential body portion half, horizontally along the top end surface 54 of the body portion 52, and then downwardly along the opposite circumferential body portion half to the bottom end 56 of the body portion 52. The two plating sections 78a,78b are electrically isolated from one another by (1) the unplated inner notch side surface 60a, (2) the unplated bottom end 56 of the body portion 52, (3) the unplated outer side edges 64 of the ribs 58a, and (4) the body slot 72.

Referring now to FIGS. 2–4, to operatively mount the SMT device 22 on the circuit board 10a, the SMT device 22 is laterally inserted into the adapter notch 66, as indicated by the dashed arrow 82 in FIG. 4, to respectively bring the device end sections 36a,36b into conductive engagement with the portions of the body plating sections 78a,78b that horizontally extend across the lower and upper notch end surfaces 70 and 68. The end sections 36a,36b are then appropriately soldered to the portions of the body plating sections 78a,78b that they respectively engage.

Next, as indicated by the dashed arrow 84 in FIG. 4, a lower longitudinal portion of the adapter structure 40 is downwardly inserted into the segmentally plated through hole 42 (see FIG. 2) in a manner such that, as best illustrated in FIG. 3, diametrically opposite portions of the plating sections 78a,78b respectively engage the through hole plating segments 44,46 and lower longitudinal portions of the ribs 58a enter the opposite unplated through hole portions 42a that circumferentially separate the through hole plating segments 44,46. As can be seen, the ribs 58a serve to circumferentially align the adapter structure 40 with the through hole plating segments 44,46. Slot 72 in the lower Longitudinal portion of the adapter structure 40 permits facing halves of such longitudinal portion to resiliently flex toward one another to thereby facilitate the operative insertion of the adapter structure 40 into the segmentally plated through hole 42.

The inserted portion of the adapter structure 40 is then soldered in place within the segmentally plated through hole 42 using a solder material having a lower melting point than the solder used to anchor the SMT device 22 in place within the adapter structure notch 66. In this manner, the soldering of the adapter structure 40 within the through hole 42 will not loosen the solder bond between the device 22 and the carrier structure 40.

As can be best seen in FIG. 2, the conductive end 36a of the vertically oriented SMT device 22 is electrically coupled to the signal plane 20 via the body plating section 78a and the through hole plating segment 44, and the conductive end 36b of the device 22 is electrically coupled to the ground plane 18 via the body plating section 78b and the through hole plating segment 46. The improved SMT device mounting apparatus and methods of the present invention thus achieve the same electrical connection result as that in the conventional circuit board 10 shown in FIG. 1 (Prior Art), but do so in a manner utilizing substantially less circuit board side surface area.

While the adapter structure 40 has been representatively illustrated as being used to mount a single SMT device 22 on the circuit board 10a, it will be appreciated by those of skill in this particular art that the adapter structure 40 could, by simply forming one or more additional notches therein, operatively mount more than one SMT device on the circuit board 10a, the plurality of SMT devices so mounted being series connected between the illustrated ground and signal planes.

Also, while the SMT device 22 has been representatively illustrated as being interconnected by the adapter structure 40 between an interior substrate ground plane and signal plane, it will be readily appreciated by those of skill in this art that the carrier structure 40 could alternatively be utilized to interconnect an SMT device (1) between other electrically conductive circuit board portions within a substrate interior, (2) between surface disposed electrically conductive circuit board portions on opposite sides of a circuit board substrate, or (3) between electrically conductive interior and exterior side surface portions of a circuit board.

The foregoing detailed description is to be clearly understood as being given by way of illustration and example only, the spirit and scope of the present invention being limited solely by the appended claims.

What is claimed is:

1. Circuit board apparatus comprising:

a dielectric substrate member having opposite first and second side surfaces;

spaced apart first and second electrically conductive structures carried by said substrate member;

a through hole extending through said substrate member and opening outwardly through said first and second side surfaces, said through hole having an interior side surface;

spaced apart first and second electrically conductive plating segments disposed on said interior side surface of said through hole and respectively coupled to said first and second electrically conductive structures;

an adapter structure extending along a longitudinal axis, said adapter structure having a first longitudinal portion coaxially received in said through hole, a second longitudinal portion extending outwardly from said through hole, a depression formed in said second longitudinal portion, and first and second electrically isolated exterior portions respectively and conductively coupled to said first and second plating segments; and an SMT type electronic component secured within said depression of said adapter structure and having opposite electrically conductive first and second end sections respectively and conductively coupled to said first and second plating segments of said through hole through said first and second electrically isolated exterior portions of said adapter structure.

2. The circuit board apparatus of claim 1 wherein:

said adapter structure includes a generally cylindrical dielectric body, and said first and second electrically isolated exterior portions are spaced apart metal plating sections formed externally on said dielectric body and extending along opposite sides of said second longitudinal portion of said adapter structure.

3. The circuit board apparatus of claim 2 wherein:

said depression of said adapter structure extends inwardly through a side of said second longitudinal portion transversely to said longitudinal axis, and said first and second end sections of said SMT type electronic component are spaced apart in a direction generally parallel to said longitudinal axis.

4. The circuit board apparatus of claim 1 wherein:

said first and second electrically conductive plating segments are circumferentially spaced apart on said interior side surface of said through hole and circumferentially separated by nonplated sections of said interior side surface of said through hole.

5. The circuit board apparatus of claim 4 wherein:

said first and second electrically conductive structures carried by said substrate member are disposed within the interior thereof.

6. The circuit board apparatus of claim 5 wherein:

said first and second electrically conductive structures are ground and signal plane portions of said circuit board apparatus.

7. The circuit board apparatus of claim 4 wherein:

said adapter structure has a spaced pair of external ribs longitudinally extending along its length and being received between said first and second plating segments of said through hole at said nonplated sections of said interior side surface of said through hole.

8. The circuit board of claim 4 wherein:

said first longitudinal portion of adapter structure has an outer end surface, and said adapter structure further includes a longitudinal slot extending inwardly through said outer end surface and dividing said first longitudinal portion generally into two laterally opposing halves that are resiliently flexed toward one another.

9. Circuit board apparatus comprising:

a circuit board structure including a dielectric substrate member having opposite first and second side surfaces, spaced apart first and second electrically conductive structures carried by said substrate member, a through hole extending through said substrate member and opening outwardly through said first and second side surfaces, said through hole extending along a first axis and having an interior side surface, and spaced apart first and second electrically conductive plating segments disposed on said interior side surface of said through hole and respectively coupled to said first and second electrically conductive structures;

an SMT type electronic component having opposite first and second electrically conductive end sections spaced apart along a second axis; and support means, complementarily received in said through hole and extending outwardly therefrom past said first substrate side surface, for supporting said electronic component outwardly of said first substrate side surface in an orientation in which said first and second axes are in a parallel, adjacent relationship, and for electrically coupling said first and second electrically conductive plating segments, respectively, to said first and second end sections of said electronic component.

10. The circuit board apparatus of claim 9 wherein:

said first and second electrically conductive plating segments are circumferentially spaced around said interior side surface of said through hole.

11. The circuit board apparatus of claim 10 wherein:

said first and second electrically conductive structures are disposed within the interior of said substrate member.

12. The circuit board apparatus of claim 11 wherein:

said first and second electrically conductive structures are ground and signal plane portions of said circuit board apparatus.

13. Circuit board apparatus comprising:

a dielectric substrate member having opposite first and second side surfaces;

spaced apart first and second electrically conductive structures disposed within said substrate member;

a through hole extending through said substrate member and opening outwardly through said first and second side surfaces, said through hole having an interior side surface;

circumferentially spaced apart first and second electrically conductive metal plating segments disposed on said interior side surface of said through hole and respectively coupled to said first and second electrically conductive structures;

an adapter structure having a generally cylindrical dielectric body extending along a first axis and having outer ends, a first longitudinal portion coaxially received in said through hole, a second longitudinal portion extending outwardly from said through hole, a lateral notch formed in said second longitudinal portion and having a nonplated inner side surface extending between first and second facing end surfaces disposed generally transversely to said first axis and respectively facing said outer ends of said adapter structure, a first exterior metal plating section electrically coupled to said first electrically conductive metal plating segment of said through hole and extending therefrom along said body into said notch along said second end surface of said notch thereof, and a second exterior metal plating section electrically isolated from said first exterior metal plating section, said second exterior metal plating section being electrically coupled to said second electrically conductive metal plating segment of said through hole and extending therefrom along said body into said notch along said first end surface of said notch thereof; and an SMT type electronic component having first and second electrically conductive opposite end sections spaced apart along a second axis, said SMT type electronic component being received within said notch with said second axis being generally parallel to said first axis, said first electronically conductive end section of said SMT type electronic component being electrically coupled to the portion of said second exterior metal plating section extending along said first end surface of said notch, and said second electronically conductive end section of said SMT type electronic component being electrically coupled to the portion of said first exterior metal plating section extending along said second end surface of said notch.

14. The circuit board apparatus of claim 13 wherein:

portions of said first and second exterior metal plating sections respectively face and are soldered to said first and second electrically conductive metal plating segments of said through hole.

15. The circuit board apparatus of claim 14 wherein:

said first and second electronically conductive end sections of said SMT type electronic component are respectively soldered to the portions of said second and first exterior metal plating sections extending across said first and second end surfaces of said notch respectively.

16. The circuit board apparatus of claim 13 wherein:

said first and second electrically conductive structures are ground and signal plane portions of said circuit board apparatus.

17. The circuit board apparatus of claim 13 wherein:

said body of said adapter is formed from a plastic material, said first longitudinal portion of said body has an outer end and a slot extending inwardly through said outer end and generally dividing said first longitudinal portion of said body into facing lateral halves.

18. The circuit board apparatus of claim 17 wherein:

said first and second electrically conductive metal plating segments of said through hole are separated by unplated portions of said interior side surface of said through hole, and said body of said adapter has diametrically opposite ribs extending along its length, wherein said ribs having unplated outer side surfaces, and being received in said unplated portions of said through hole between said first and second electrically conductive metal plating segments of said through hole.

19. The circuit board apparatus of claim 18 wherein:

said slot longitudinally extends through said ribs.

* * * * *